United States Patent [19]

Navratil

[11] 4,069,476

[45] Jan. 17, 1978

[54] ARRANGEMENT FOR PRODUCING A CONSTANT MAGNETIC FIELD

[75] Inventor: Franz Navratil, Munich, Germany

[73] Assignee: Siemens Aktiengesellschaft, Berlin & Munich, Germany

[21] Appl. No.: 667,530

[22] Filed: Mar. 17, 1976

[30] Foreign Application Priority Data

Mar. 26, 1975 Germany ............................ 2513441

[51] Int. Cl.² ............................................ G11C 19/08
[52] U.S. Cl. ...................................................... 365/6
[58] Field of Search ................ 340/174 TF, 174 PM; 335/297, 306

[56] References Cited

U.S. PATENT DOCUMENTS 3,711,841  1/1973  Geusic et al. ................ 340/174 TF
3,927,397  12/1975  Chow et al. ................... 340/174 TF

OTHER PUBLICATIONS

IBM Technical Disclosure Bulletin — vol. 16, No. 7, Dec. 1973, pp. 2129–2130.

Primary Examiner—James W. Moffitt
Attorney, Agent, or Firm—Hill, Gross, Simpson, Van Santen, Steadman, Chiara & Simpson

[57] ABSTRACT

The invention relates to an arrangement for generating a magnetic supporting field for a magnetic cylindrical domain store, having a soft-magnetic plate matrix comprising at least two plane plates arranged parallel to each other at an interval, and having two bar-shaped permanent magnets situated between said plates and arranged at an interval, wherein said permanent magnets have their respective longitudinal middle axes parallel to each other and are magnetized perpendicularly thereto, and wherein at least one of which is rotatable about its longitudinal middle axis.

2 Claims, 4 Drawing Figures

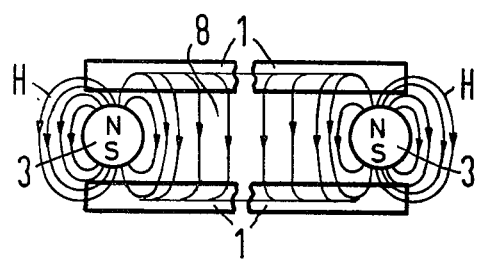
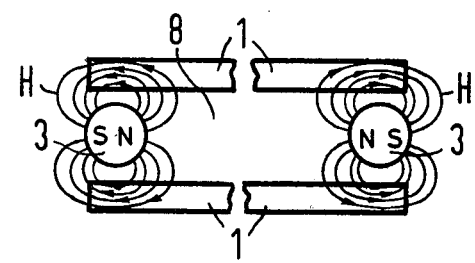
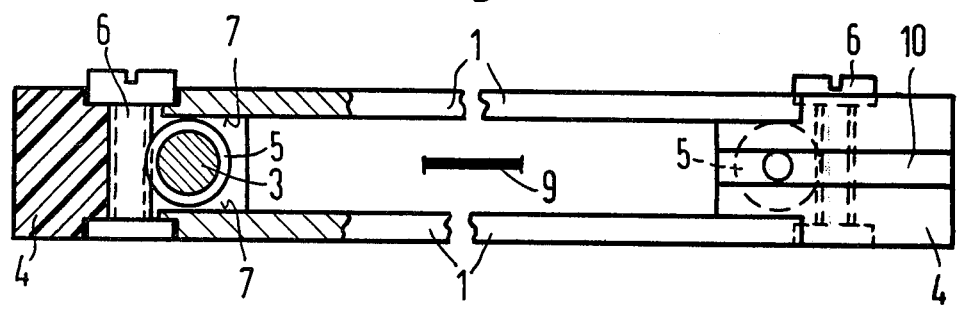
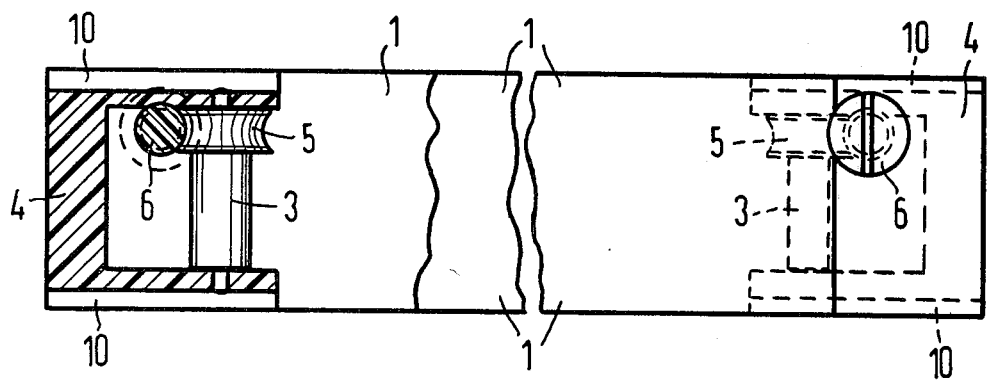

ARRANGEMENT FOR PRODUCING A CONSTANT MAGNETIC FIELD

BACKGROUND OF THE INVENTION

1. Field of the Invention

The present invention relates to an arrangement for generating a constant magnetic field, in particular, a magnetic supporting field for a magnetic cylindrical domain store wherein said arrangement permits a fine tuning of the supporting field.

The object of the invention is realized by a magnetic matrix comprising at least two magnetic plates having softmagnetic properties, arranged plane-parallel to one another at requisite intervals, and two bar-shaped permanent magnets situated between these plates and arranged congruently and at an interval, which permanent magnets have their longitudinal middle axes parallel to each other and are magnetized perpendicularly thereto, and whereby at least one of the permanent magnets is rotatable around its longitudinal middle axis.

The invention offers a considerable advantage in the development of cylindrical domain storing matrixes.

SUMMARY OF THE INVENTION

The invention relates to an arrangement for producing a constant magnetic field, in particular, a magnetic supporting field, for a magnetic cylindrical domain transport-store.

Cylindrical domain transport-stores have a block shaped, in particular, a layer shaped, storage matrix, generally comprising a magnetic garnet- or orthoferrite, with cylindrical domains magnetized perpendicularly to the plane of stratification. The magnetization direction of said cylindrical domains is inversely directed to the magnetization of the surroundings and to a magnetic supporting or, respectively, retaining field, as served by a constant magnetic field, and have a preferably periodic manipulation pattern whose individual elements of a magnetizable material, in particular, of a magnetostriction-free Ni-Fe-alloy, are applied upon the one layer surface in a layer- and rectangle-shape fashion. The translation of the cylindrical domains occurs hereby under the influence of a high-frequency magnetic rotating-field whose field vector rotates parallel to the plane of stratification.

The individual magnetic elements of the manipulation pattern generate residuary magnetic fields in said rotary magnetic field whereby said cylindrical domains migrate to energy-favorable levels at the individual elements. When the rotary magnetic field is rotated in the plane of stratification, these energy minimums decay and correspondingly new energy minimums appear at other points on the manipulation pattern, to which the cylindrical domains migrate. With a suitable geometry of the manipulation pattern, the cylindrical domains shift one period of the manipulation pattern with each one full rotation of the magnetic rotary field. In a constantly rotating magnetic field the cylindrical domains can thereby be translationally restrained to paths prescribed by the manipulation pattern.

The magnetic rotary field is generated in a crossed coil-pair such as a Helmholtz coil pair, whereby, on the basis of energy considerations, the coils, which can also be solenoids, are in each case supplemented to resonant circuits which are triggered with a respective alternating current. To guarantee an ideally rotating magnetic field in the operating space of the coil, attention is focused in particular on the phase position, and the amplitude of these triggering currents.

Said cylindrical domains are formed by shrinking said strip-shaped domain by subjecting them to a counterparallel vectored magnetic supporting field. In this context the cylindrical domains are only stable at a certain fieldstrength reference of the magnetic supporting field and, as soon as one collapses below this reference, the cylindrical domains unroll to form strip domains. If this region is exceeded, the cylindrical domains disappear as a result of so-called collapse. If possible the supporting field is to be absolutely uniform and permanent so that it does not collapse even with main power loss. The permissible, narrow tolerances of the supporting field require hereby a very good homogeneity of the supporting field over the entire storage matrix, as well as a good adaptability of the field strength to the storage matrix, characteristics which can be subject to certain charge dispersions.

The object of the present invention is to create an arrangement for generating a constant magnetic field, in particular, a magnetic supporting field for a magnetic cylindrical domain store, wherein said arrangement permits a fine tuning of the supporting field.

The object of the invention is realized by a magnetic matrix comprising at least two magnetic plates having soft-magnetic properties, arranged plane-parallel to one another at requisite intervals, and two bar-shaped permanent magnets situated between these plates and arranged congruently and at an interval, which permanent magnets have their longitudinal middle axes parallel to each other and are magnetized perpendicularly thereto, and whereby at least one of the permanent magnets is rotatable around its longitudinal middle axis.

Preferably the plates are geometrically identical and are aligned congruently to each other and the bar-shaped permanent magnets are made of hard-magnetic ferrite.

By means of the selected arrangement the magnetic supporting field can be very finely adjusted between the value of zero and a maximum value predetermined by the magnetic properties and the air gap size. In consequence, a single arrangement of this kind suffices for the adjustment of the optimum supporting field for various storage mediums. This offers a considerable advantage in the development of cylindrical domain stores.

BRIEF DESCRIPTION OF THE DRAWINGS

FIG. 1 is a schematic top view representation depicting said arrangement for generating a finely adjustable magnetic supporting field, comprising two discrete bar-shaped permanent magnets arranged in said magnetic matrix comprising two plates having soft magnetic properties;

FIG. 2 is a schematic top view representation depicting said arrangement for generating a finely adjustable magnetic supporting field comprising two discrete bar-shaped permanent magnets arranged in said magnetic matrix wherein said bar-shaped magnets have been rotated by 90°;

FIG. 3 is a schematic cross-sectional top view depicting the adjustment means located in said magnetic matrix in accordance with the principles of the invention; and FIG. 4 is a schematic cross-sectional side view depicting the adjustment means located in said magnetic matrix in accordance with the principles of the invention.

DESCRIPTION OF THE PREFERRED EMBODIMENTS

In the diagrammatic representation according to FIGS. 1 and 2, each plate 1 having soft-magnetic properties is arranged plane-parallel to the other at requisite interval gap 8. A pair of bar-shaped permanent magnets as indicated by reference 3 each having their longitudinal middle axes parallel to the other are magnetized perpendicularly thereto. At least one of said permanent magnets 3 is rotatable about its longitudinal middle axis.

In principle, any optional materials are selectable for the plates and the bar-shaped permanent magnets, providing they contain the requisite properties to produce, in the gap space 8, a sufficiently large supporting field H of adequate homogeneity. Since a store 9, represented in outline in said gap space 8 according to FIG. 3, is incorporated in a Helmholtz coil-pair which carries a high-frequency current (100 kHz and higher), oxidic permanent or, respectively, soft magnets such as hard-magnetic or soft-magnetic ferrites are preferred. The plates of soft-magnetic ferrite materials shield the high-frequency magnetic rotating field vis-a-vis the surroundings, without an occurrence of the residuary eddy-current losses which are common with other metallic magnet materials. Preferably, the materials for the elements serving to generate the magnetic supporting field, such as plates and permanent magnets, are selected and matched to the store layer material in such a fashion that their temperature-dependent magnitudes largely compensate each other.

In operation the North/South position of the permanent magnets 3 as shown in FIG. 1, the magnetic flux H is essentially closed via the soft-magnetic plates 1. The maximum achievable field intensity in the gap space 8 corresponds to this position of the permanent magnets 3. The East/West position of the bar-magnets 3 as shown in FIG. 2, the gap space 8 is substantially field-free. As a result of the various potential positions of the bar-magnets 3, which lie between the positions represented in FIGS. 1 and 2, all possible field intensities between the positions according to FIGS. 1 and 2 are adjustable in the work space 8.

In the detailed sample embodiment of an arrangement for producing a magnetic supporting field as shown in FIGS. 3 and 4, each bar-shaped permanent magnet 3 is positioned rotatably between the legs of a U-shaped carrier 4 of synthetic material. The permanent magnets 3 are, in each case, immovably attached to a worm gear 5 which meshes with a worm screw 6. The worm gears, worm screws and carriers 4 consist preferably of a synthetic material having a low thermal expansion. The carriers 4 are tapered in the ends of their legs facing each other and are formed with contact surfaces 7. The plates 1 are cemented, at their ends, upon the contact surfaces 7. Additionally the carriers 4 are equipped with, for example, groove-shaped recesses 10 which serve to receive a carrier, not shown in the drawing, for the store 9, which is only outlined-in. As a result of the exact plane-parallel alignment of the plates 1 to each other, which is possible because of the carriers 4, the homogeneity of the magnetic supporting field lies below the limit $H \leq 10^{-3}$ determinable with ordinary means. Moreover, by a corresponding selection of the gear ratio of the worm gear train 5, 6, any desired fine adjustment is achievable, for example a field alteration $H = 1\%$ at 90° screw turn.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims.

I claim as my invention:

1. An arrangement for generating a constant magnetic supporting field for a magnetic cylindrical domain store, comprising a magnetic matrix of at least two magnetic plates having soft magnetic properties arranged plane-parallel to each other and separated by an interval gap, and two bar-shaped permanent magnets located within said interval gap between said plates and arranged concurrently and substantially apart, said permanent magnets having their longitudinal middle axes parallel to each other and magnetized perpendicularly thereto, at least one of said permanent magnets rotatable about its longitudinal axis, a store carrier for holding said domain store in said supporting field, and a U-shaped carrier comprising a means for mounting and aligning said soft magnetic plates and having magnetically non-conducting properties of only low thermal expansion, wherein each of said bar-shaped permanent magnets is rotatably mounted between the legs of said U-shaped carrier.

2. The arrangement for generating a constant magnetic supporting field for a magnetic cylindrical domain store as defined in claim 1, wherein each permanent magnet further comprises a worm gear which is immovably attached at one end of said permanent magnet and which meshes with a corresponding worm screw.

* * * * *